United States Patent
Cheng et al.

(10) Patent No.: US 10,211,320 B2
(45) Date of Patent: Feb. 19, 2019

(54) FIN CUT WITHOUT RESIDUAL FIN DEFECTS

(71) Applicant: International Business Machines Corporation, Armonk, NY (US)

(72) Inventors: Kangguo Cheng, Schenectady, NY (US); Pouya Hashemi, White Plains, NY (US); Alexander Reznicek, Troy, NY (US); Dominic J. Schepis, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/664,811

(22) Filed: Jul. 31, 2017

(65) Prior Publication Data

US 2017/0358656 A1    Dec. 14, 2017

Related U.S. Application Data

(62) Division of application No. 14/924,162, filed on Oct. 27, 2015, now Pat. No. 9,722,052.

(51) Int. Cl.
*H01L 29/00* (2006.01)
*H01L 29/66* (2006.01)
(Continued)

(52) U.S. Cl.
CPC .... *H01L 29/6681* (2013.01); *H01L 21/02639* (2013.01); *H01L 21/823431* (2013.01);
(Continued)

(58) Field of Classification Search
None
See application file for complete search history.

(56) References Cited

U.S. PATENT DOCUMENTS

| 6,767,793 B2 | 7/2004 | Clark |
| 7,638,381 B2 | 12/2009 | Cheng |

(Continued)

OTHER PUBLICATIONS

Maszara, W.P. et al., "FinFETs—Technology and circuit design challenges", Proceedings of the 2013 IEEE European Solid-State Device Research Conference (ESSDERC), pp. 3-8 (2013).
(Continued)

*Primary Examiner* — Hung Vu
(74) *Attorney, Agent, or Firm* — Scully, Scott, Murphy & Presser, P.C.; L. Jeffrey Kelly, Esq.

(57) ABSTRACT

A method of forming semiconductor fins is provided. Sacrificial fins are provided on a surface of substrate. A hard mask layer, formed around the sacrificial fins and the gaps therebetween, is made coplanar with a topmost surface of the sacrificial fins. A fin cut mask then covers a portion of the sacrificial fins and partly covers a sacrificial fin. Trenches are formed in the hard mask layer by removing sacrificial fins not covered by the fin cut mask and that portion of the sacrificial fin not partly covered by the fin cut mask. Spacers are formed on the sidewalls of the trenches and a plug is formed in the trench formed by removing that portion of the sacrificial fin not partly covered by the fin cut mask. Semiconductor fins are grown epitaxially in the trenches having the spacers from the exposed surface of the substrate upward.

14 Claims, 4 Drawing Sheets

(51) Int. Cl.
  *H01L 29/78* (2006.01)
  *H01L 21/02* (2006.01)
  *H01L 29/10* (2006.01)
  *H01L 21/8234* (2006.01)
  *H01L 21/84* (2006.01)

(52) U.S. Cl.
  CPC ........ *H01L 21/845* (2013.01); *H01L 29/1037* (2013.01); *H01L 29/66795* (2013.01); *H01L 29/7851* (2013.01)

(56) References Cited

U.S. PATENT DOCUMENTS

| | | |
|---|---|---|
| 8,461,008 B2 | 6/2013 | Cho |
| 8,617,996 B1 | 12/2013 | Chi et al. |
| 8,658,536 B1 | 2/2014 | Choi et al. |
| 8,753,940 B1 | 6/2014 | Wei et al. |
| 8,846,490 B1 | 9/2014 | Shieh et al. |
| 8,906,807 B2 | 12/2014 | Bergendahl et al. |
| 2004/0198031 A1 | 10/2004 | Lin |
| 2014/0256144 A1 | 9/2014 | Lo et al. |
| 2016/0020109 A1* | 1/2016 | Yoo ..................... H01L 21/3085 438/275 |

OTHER PUBLICATIONS

Zhang, P. et al., "An edge-placement yield model for the cut-hole patterning process", Proc. SPIE Advanced Lithography Symposium 90521, pp. 90521Q-1 to 90521Q-12 (2014).

List of IBM Patents or Patent Applications Treated as Related Dated Jul. 31, 2017 2 Pages.

\* cited by examiner

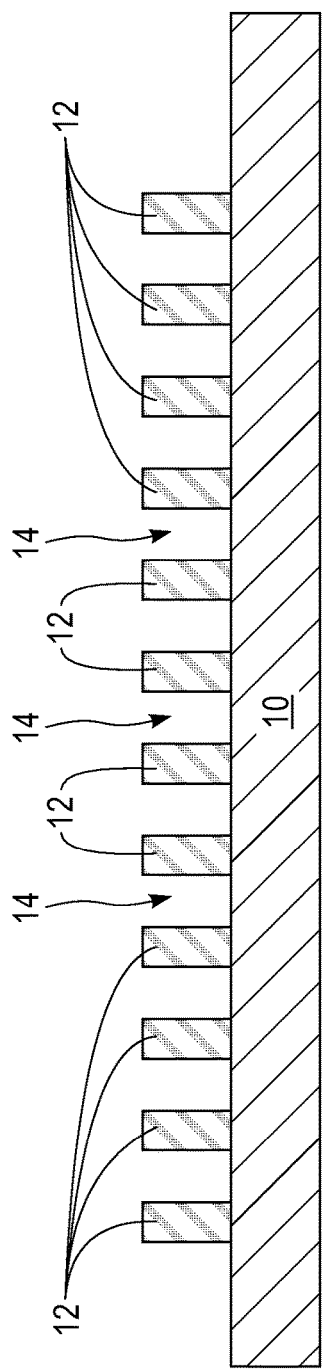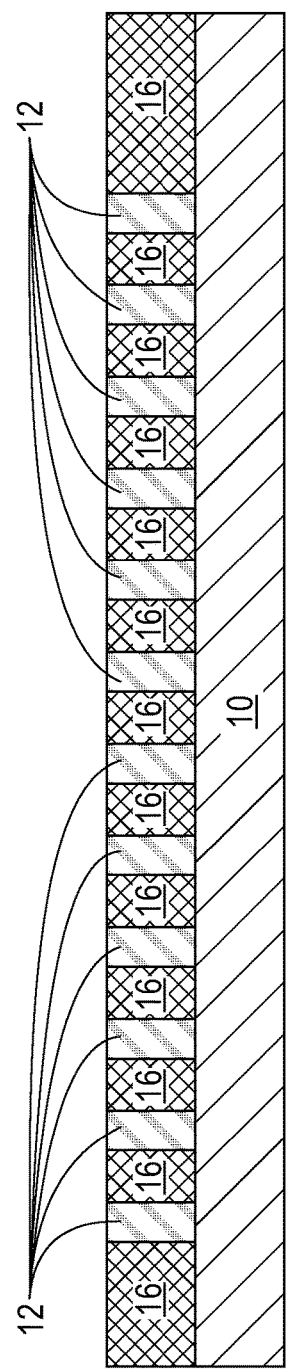

FIN CUT WITHOUT RESIDUAL FIN DEFECTS

BACKGROUND

The present application relates to semiconductor technology; more particularly, to a method of forming a semiconductor structure comprising fins grown from a surface of a semiconductor substrate, the fins thus obtained being without residual fin defects.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, semiconductor fin field effect transistors (FinFETs), is the next step in the evolution of complementary metal oxide semiconductor (CMOS) devices. Semiconductor fin field effect transistors (FinFETs) can achieve higher drive currents with increasingly smaller dimensions as compared to conventional planar FETs.

Current FinFET technology requires removal of fins from the region where they are not desired so that fins are formed only in the regions where they are needed. Removing undesired fins requires applying a fin cut mask. However, there is inherent variation when placing the mask on the wafer. For closely packed fins, it becomes extremely challenging, if not impossible, to precisely place the mask relative to fin patterns. An excessive misalignment of the cut mask to the fins results in either an incomplete removal of undesired fins or a partial removal of device fins. Either case results in a yield issue.

There is thus a need for a method to form fins in FinFET devices without the above yield issue.

SUMMARY

The present application provides a method of forming semiconductor fins. The method includes providing an array of sacrificial fins having gaps therebetween on a surface of substrate. A hard mask layer is then formed on the surface of the sacrificial fins and in the gaps. The hard mask layer is planarized until coplanar with a topmost surface of the sacrificial fins. A fin cut mask is then provided to cover a portion of the sacrificial fins, the mask further partly covering at least one sacrificial fin, e.g., by having an edge of the fin cut mask land on a sacrificial fin. Trenches are then formed in the planarized hard mask layer to expose the surface of the substrate by selectively removing the sacrificial fins that are not covered by the fin cut mask and by selectively removing that portion of the at least one sacrificial fin that is not partly covered by the fin cut mask. The fin cut mask is removed and spacers are formed on the sidewalls of the trenches and a plug is formed in the trench that occurs by the removal of that portion of the at least one sacrificial fin that is not partly covered by the fin cut mask. Fins are then grown epitaxially in the trenches having the spacers on the sidewalls from the exposed surface of the substrate upward.

In one aspect of the present application, a method of forming fins for FinFET devices is provided. In one embodiment, the method includes providing an array of sacrificial fins, the sacrificial fins having gaps therebetween and being of a dielectric material such as silicon nitride (herein, SiN) on a semiconductor substrate such as, for example, silicon or silicon-on-insulator (SOI). A hard mask layer of a dielectric material, such as an oxide, e.g., silicon oxide, is deposited to coat the surface of the sacrificial fins, topmost and sidewall surfaces, and to fill in the gaps and otherwise surround the sacrificial fins. This hard mask layer is planarized, including by chemical mechanical polishing (CMP) so that it is coplanar with the topmost surface of the sacrificial fins. Trenches are then formed by using an inverse polarity of a fin cut mask to cut one or more sacrificial fins from the array down to the semiconductor substrate. Sacrificial fins only partly covered by the fin cut mask, including those where an edge of the fin cut mask has landed, are selectively removed by a directional etch down to the semiconductor substrate to form trenches less than the full width of the associated sacrificial fins. The fin cut mask is removed. Next, a very thin oxide layer is deposited by atomic layer deposition (ALD) to form a sidewall spacer on the full width of each of the fully opened trenches, while forming plugs in the trenches that are less than the full width of the associated sacrificial fins. Fins are then grown epitaxially from the semiconductor substrate surface at the bottom of the fully opened trenches upward. In another embodiment, the hard mask layer, the spacers, and the plugs are recessed to partly expose the tops of the epitaxially grown fins. In another embodiment, the hard mask layer, the sacrificial fins that were covered by the fin cut mask, the spacers, and the plugs, are removed to fully expose the epitaxially grown fins. Conventional FinFET process can continue thereafter.

In another aspect of the present application, a semiconductor structure is provided. In one embodiment, the semiconductor structure includes a semiconductor substrate having a surface upon which surface is an array of sacrificial fins. Each of the sacrificial fins of the array is of substantially the same width. Also on the surface of the substrate is at least one sacrificial fin that has a width that is less than the width of the sacrificial fins of the array. In another embodiment, the semiconductor structure also has an array of semiconductor fins, each of the semiconductor fins are of substantially the same width, which width is less than the width of the sacrificial fins of the array.

BRIEF DESCRIPTION OF SEVERAL VIEWS OF THE DRAWINGS

FIG. 1 is a cross sectional view of an exemplary semiconductor structure including a semiconductor substrate with an array of sacrificial fins having gaps therebetween on a surface of the semiconductor substrate.

FIG. 2 is a cross sectional view of the exemplary structure of FIG. 1 showing a hard mask layer formed between the gaps and planarized to a topmost surface of the sacrificial fins.

DETAILED DESCRIPTION

Figure 3:
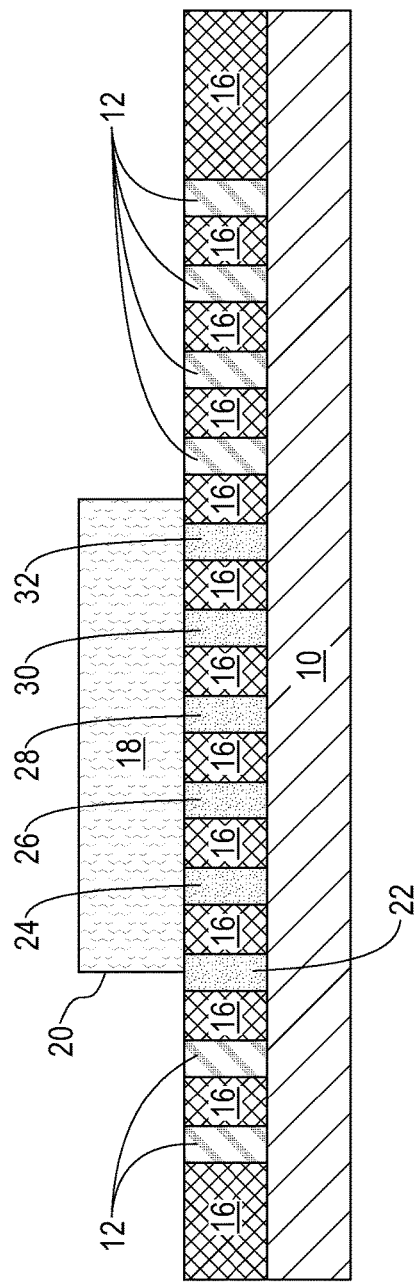
FIG. 3 is a cross sectional view of the exemplary structure of FIG. 2 showing a fin cut mask covering a portion of the sacrificial fins and hard mask layer with the edge of the fin cut mask landing on a sacrificial fin thereby leaving a portion of that fin not covered by the fin cut mask.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure including a semiconductor substrate 10 and an array of sacrificial fins 12. In some embodiments of the present application, the semiconductor substrate 10 can be a bulk semiconductor substrate. The term "bulk semiconductor substrate" denotes a substrate that is entirely composed of at least one semiconductor material. When a bulk semiconductor substrate is employed as semiconductor substrate 10, the bulk semiconductor substrate can be comprised of any semiconductor material including, but not limited to, Si, Ge, SiGe, SiC, SiGeC, and III/V compound semiconductors such as, for example, InAs, GaAs, and InP. Multilayers of these semiconductor materials can also be used as the semiconductor material of the bulk semiconductor substrate. In one embodiment, the bulk semiconductor substrate that can provide the semiconductor substrate 10 can be comprised of a single crystalline semiconductor material, such as, for example, single crystalline silicon. In other embodiments, the bulk semiconductor substrate that can provide the semiconductor substrate 10 may comprise a polycrystalline or amorphous semiconductor material.

In another embodiment, the semiconductor substrate 10 may comprise a semiconductor-on-insulator (SOI) substrate (not specifically shown). Although not specifically shown, one skilled in the art understands that an SOI substrate includes a handle substrate, an insulator layer located on an upper surface of the handle substrate, and a topmost semiconductor layer located on an upper surface of the insulator layer. The handle substrate provides mechanical support for the insulator layer and the topmost semiconductor layer.

The handle substrate and the topmost semiconductor layer of the SOI substrate may comprise the same, or different, semiconductor material. The semiconductor material of the handle substrate and the topmost semiconductor layer can include one of the semiconductor materials mentioned above for the bulk semiconductor substrate. Multilayers of semiconductor materials can also be used as the semiconductor material of the handle substrate and the topmost semiconductor layer. In one embodiment, the handle substrate and the topmost semiconductor layer are both comprised of silicon. In some embodiments, the handle substrate is a non-semiconductor material including, for example, a dielectric material and/or a conductive material. In yet other embodiments, the handle substrate can be omitted and a substrate including the insulator layer and the topmost semiconductor layer can be used in the present application.

In some embodiments, the handle substrate and the topmost semiconductor layer of the SOI substrate may have the same or different crystal orientation. For example, the crystal orientation of the handle substrate and/or the semiconductor layer may be {100}, {110}, or {111}. Other crystallographic orientations besides those specifically mentioned can also be used in the present application. The handle substrate and/or the top semiconductor layer of the SOI substrate may be a single crystalline semiconductor material, a polycrystalline material, or an amorphous material. Typically, at least the topmost semiconductor layer is a single crystalline semiconductor material. In some embodiments, the topmost semiconductor layer that is located atop the insulator layer can be processed to include semiconductor regions having different crystal orientations.

The insulator layer of the SOI substrate may be a crystalline or non-crystalline oxide or nitride. In one embodiment, the insulator layer is an oxide such as, for example, silicon dioxide. The insulator layer may be continuous or it may be discontinuous. When a discontinuous insulator region is present, the insulator region can exists as an isolated island that is surrounded by semiconductor material.

The SOI substrate may be formed utilizing standard processes including for example, SIMOX (separation by ion implantation of oxygen) or layer transfer. When a layer transfer process is employed, an optional thinning step may follow the bonding of two semiconductor wafers together.

The optional thinning step reduces the thickness of the topmost semiconductor layer to a layer having a thickness that is more desirable.

In one example, the thickness of the topmost semiconductor layer of the SOI substrate can be from 10 nm to 100 nm. In some embodiments, and when an ETSOI (extremely thin semiconductor-on-insulator) substrate is employed, the topmost semiconductor layer of the SOI has a thickness of less than 10 nm. If the thickness of the topmost semiconductor layer is not within one of the above mentioned ranges, a thinning step such as, for example, planarization or etching can be used to reduce the thickness of the topmost semiconductor layer to a value within one of the ranges mentioned above. The insulator layer of the SOI substrate typically has a thickness from 1 nm to 200 nm, with a thickness from 100 nm to 150 nm being more typical. The thickness of the handle substrate of the SOI substrate is inconsequential to the present application.

Sacrificial fins 12 are formed in an array on a surface of semiconductor substrate 10, the array in FIG. 1 being illustrated on the top surface of substrate 10. The fins are formed from a first dielectric material including silicon nitride (SiN), or silicon boron carbon nitride (SiBCN). In one embodiment, the first dielectric material is deposited onto the surface of semiconductor substrate 10 via chemical vapor deposition or plasma-enhanced chemical vapor deposition. The sacrificial fins 12 may be formed by a fin patterning process which process may include lithography and etching.

Lithography includes forming a photoresist material (not shown) atop a material to be patterned; in the present application, the photoresist material is formed atop the first dielectric material such as SiN. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the first dielectric material. The pattern provided by the patterned photoresist material is thereafter transferred into the first dielectric material utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used to form sacrificial fins 12.

In another embodiment, the fin patterning process may include a sidewall image transfer (SIT) process. The SIT process includes forming a mandrel material layer (not shown) atop the material or material layers that are to be patterned; in the present application, this material is the first dielectric material, such as SiN. The mandrel material layer (not shown) can include any material (semiconductor, dielectric or conductive) that can be selectively removed from the structure during a subsequently performed etching process. In one embodiment, the mandrel material layer (not shown) may be composed of amorphous silicon or polysilicon. In another embodiment, the mandrel material layer (not shown) may be composed of a metal such as, for example, Al, W, or Cu. The mandrel material layer (not shown) can be formed, for example, by chemical vapor deposition or plasma enhanced chemical vapor deposition. Following deposition of the mandrel material layer (not shown), the mandrel material layer (not shown) can be patterned by lithography and etching to form a plurality of mandrel structures (also not shown) on the topmost surface of the structure.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching.

After formation of the dielectric spacers, the SIT process continues by removing each mandrel structure. Each mandrel structure can be removed by an etching process that is selective for removing the mandrel material. Following the mandrel structure removal, the SIT process continues by transferring the pattern provided by the dielectric spacers into the underlying material or material layers. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process. Each sacrificial fin structure 12 that is formed includes a pair of vertical sidewalls that are parallel to each other. As used herein, a surface is "vertical" if there exists a vertical plane from which the surface does not deviate by more than three times the root mean square roughness of the surface. As shown in FIG. 1, the array of sacrificial fins 12 are spaced apart and have gaps 14 therebetween. The sacrificial fins 12 may be of the same or different dimensions and may have widths of 10 nm to 20 nm and a height of 15 nm to 100 nm; the gaps 14 may be of the same or different dimensions, and may have widths of 10 nm to 100 nm.

Referring to FIG. 2, a hard mask layer 16 is formed on the surface of the sacrificial fins 12 to surround the sidewall surfaces and a topmost surface of same and to fill in the gaps 14. The hard mask layer 16 may be a second dielectric material, different from the first dielectric material, such as a field oxide, including silicon oxide. In one embodiment, the hard mask layer 16 can be formed utilizing a deposition process such as, for example, chemical vapor deposition or plasma enhanced chemical vapor deposition. In another embodiment of the present application, the hard mask layer 16 can be formed utilizing a spin-on technique, such as flowable oxide. The hard mask layer 16 can have a thickness from 15 nm to 150 nm. FIG. 2 shows hard mask layer 16 after planarizing, which is an optional practice, so that its topmost surface is coplanar with the topmost surface the sacrificial fins 12.

The planarizing process used to provide the exemplary semiconductor structure shown in FIG. 2 may include chemical mechanical polishing (CMP) or grinding.

Referring to FIG. 3, a fin cut mask 18 is provided atop the planarized hard mask to cover at least a portion of the sacrificial fins; as shown in FIG. 3 sacrificial fins 24, 26, 28, 30, and 32 are covered by fin cut mask 18. Also as shown in FIG. 3, edge 20 of fin cut mask 18 lands on sacrificial fin 22 partly covering it. The cut mask is placed in a way such that all sacrificial fins that will be replaced later by actual semiconductor fins are completely exposed.

Fin cut mask 18 can include a patterned photoresist mask, and can include a hardened photoresist. By "hardened photoresist" it is meant a photoresist material that has been actinically or chemically altered or "de-protected" or "polarity switched" (which is also known as "inverse polarity") such that it is no longer soluble in its original casting solvent. The photoresist material that may be employed in the present application includes a positive-tone photoresist material or a negative-tone photoresist material. The photoresist material can be formed utilizing a deposition process such as, for example, spin-on coating or chemical solution deposition. The thickness of the fin cut mask 18 can be from 50 nm to 200 nm, although lesser and greater thicknesses can also be employed. The photoresist material of the fin cut mask is then patterned by lithography. Lithography includes exposing the blanket layer of photoresist material to a desired pattern of irradiation and then developing the photoresist material utilizing a conventional resist developer. Besides photoresist, the cut mask can be a hard mask (e.g., amorphous carbon, OPL (optical planarization layer), amorphous silicon, etc. When the cut mask is a hard mask, the hard mask can be patterned by the conventional lithography followed by etch or any other suitable patterning techniques.

Figure 4:
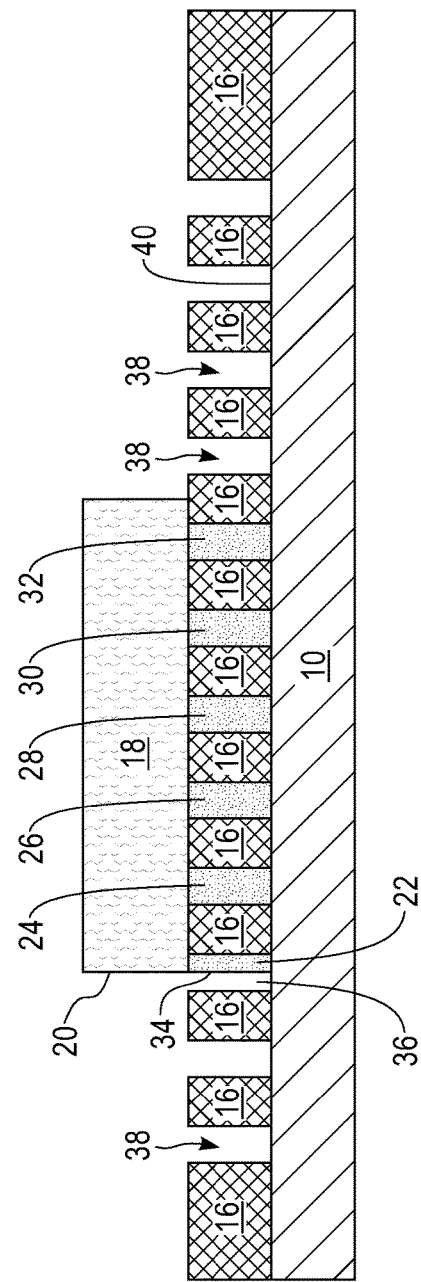
FIG. 4 is a cross sectional view of the exemplary structure of FIG. 3 showing trenches formed after the cutting out the sacrificial fins not covered by the fin cut mask, and after a directional etch to remove only that portion of the sacrificial fin that was not covered by the fin cut mask.

Referring to FIG. 4, trenches 38 are formed by removing the sacrificial fins 12 not covered by fin cut mask 18. The sacrificial fins can be removed by an etch process which is selective to the first dielectric material forming the sacrificial fins 12, e.g. SiN, but not the second dielectric material forming the hard mask layer, e.g. silicon oxide. A directional etch process, such as reactive ion etch, is preferred for removing the sacrificial fins not covered by the cut mask. The directional etch process removes sacrificial fins 12 down to the surface 40 of the semiconductor substrate 10. In regard to sacrificial fin 22 which is partly covered by fin cut mask 18, and for other sacrificial fins that are similarly partly covered by the fin cut mask, that portion that is not covered and is exposed can be selectively removed by a directional etch to create trench 36 down to surface 40. The sidewall of trench 36 that includes that portion of sacrificial fin 22 that remains unetched because it is still covered by fin cut mask 18 can have its vertical surface coplanar with fin cut mask edge 20. Trenches 38 from which the sacrificial fins 12 are entirely removed are referred to as open trenches; trench 36 that results from the partial removal of sacrificial fin 22 that is otherwise covered by fin mask 18 is referred to as a partially open trench.

Figure 5:
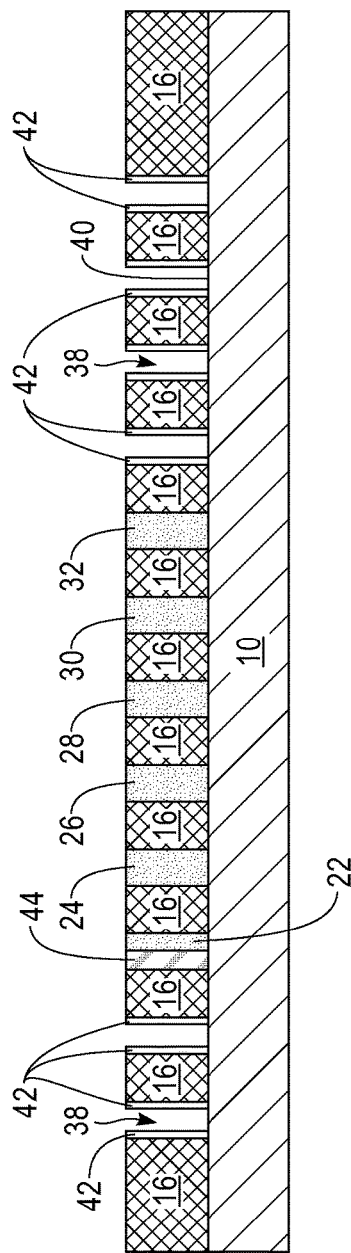
FIG. 5 is a cross sectional view of the exemplary structure of FIG. 4 showing the formation of spacers on the full with of sidewalls of the trenches, and used to form a plug in the opening formed by the removal of that portion of the sacrificial fin that was not covered by the fin cut mask.

Referring to FIG. 5, after fin cut mask 18 is removed, e.g. by processes that include plasma ashing, a thin layer of a third dielectric material is deposited on the vertical sidewalls of open trenches 38 to form spacers 42, and to form plug 44 in the partially open trench associated with sacrificial fin 22. The third dielectric material for spacers 42 can be different from the first and second dielectric materials and can be formed of dielectric metal oxides such as hafnium oxide. Processes to deposit spacer 42 onto the sidewalls can include atomic layer deposition (ALD), chemical vapor deposition (CVD), and plasma-enhanced chemical vapor deposition (PECVD). The deposition process also may result in deposits of the third dielectric material forming on the top surfaces of hard mask layer 16 and the surface 40 of the exposed semiconductor substrate (not shown in FIG. 5); these can be selectively removed by processes including anisotropic etching (e.g., reactive ion etch) to leave the spacers 42 on the vertical sidewalls of trenches 38. The spacers 42 on the vertical sidewalls of the trenches 38 have a thickness of between about 3 nm to about 10 nm. In one embodiment, this thickness is more than half the width of trench opening 36 (the trench that includes that portion of sacrificial fin 22 that remains unetched because it was partly covered by the fin mask), but less than half the width of trench opening 38 such that the third dielectric material can plug trench 36 while only partially filling trench 38. After RIE, spacers are formed in trench 38 and trenches similar to 38 whereas trench 36 and similar trenches that result from being partly covered by the fin mask are plugged.

The third dielectric material can be the same as or different from the first dielectric material comprising the sacrificial fins. The third material can be the same as or different from the second dielectric material.

Figure 6:
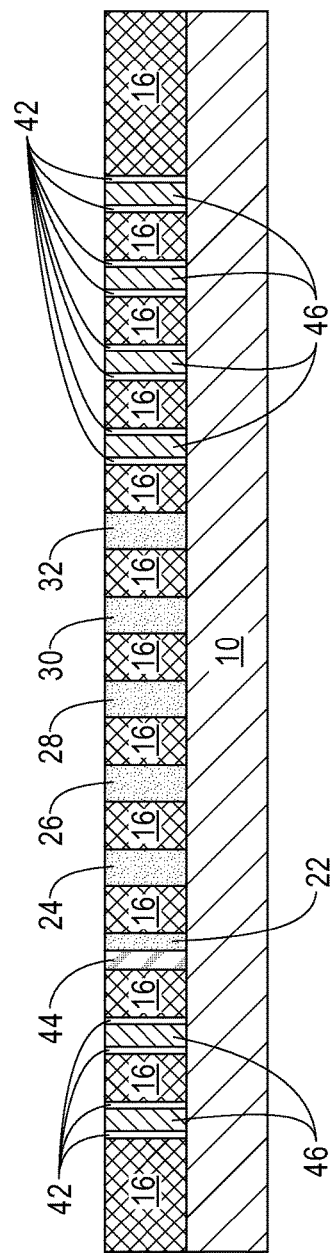
FIG. 6 is a cross sectional view of the exemplary structure of FIG. 5 showing the fins that were grown epitaxially between the spacers in the trenches from the semiconductor substrate surface upward.

Referring to FIG. 6, semiconductor fins 46 are grown upward from semiconductor surface 40 in the open trenches 38 having spacers 42. Trench 36 is plugged so that no epitaxy growth occurs in it even though the cut mask only partially covered it originally. The semiconductor fins 46 can be grown epitaxially. The terms "grown epitaxially" and "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100}orientation. In the present application, the semiconductor fins 46 have an epitaxial relationship with the underlying semiconductor substrate 10.

Examples of various epitaxial growth process apparatuses that are suitable for use in forming semiconductor fins 46 of the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. The semiconductor material that provides the semiconductor fins 46 may include any of the semiconductor materials mentioned above for semiconductor substrate 10.

Figure 7A:
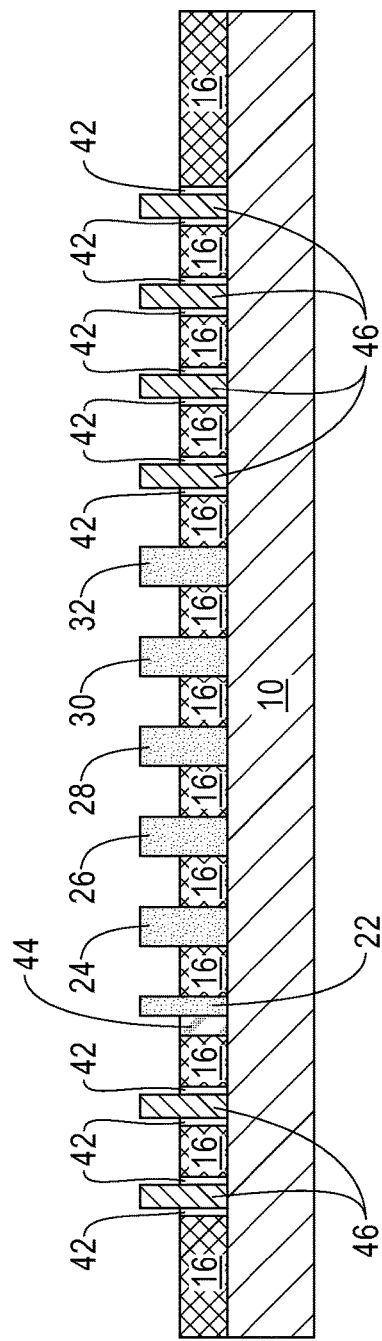
FIG. 7A is a cross sectional view of an embodiment of the exemplary structure of FIG. 6 showing the hard mask layer, spacers, and plug after being recessed to expose the topmost surfaces of the sacrificial fins that were previously covered by the fin cut mask, and to expose the topmost surfaces of the epitaxially grown semiconductor fins.
Figure 7B:
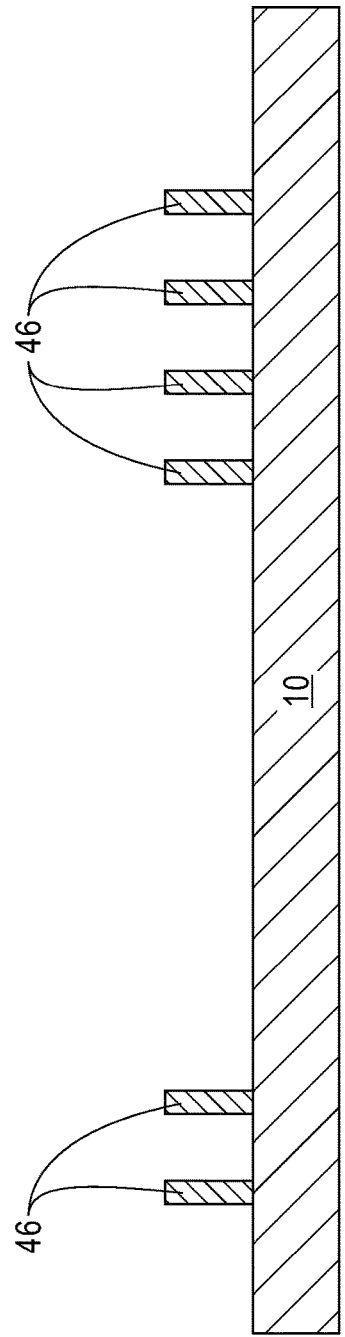
FIG. 7B is a cross sectional view of an embodiment of the exemplary structure of FIG. 5 showing the semiconductor substrate and epitaxially grown fins after the hard mask layer, spacers, plug, and sacrificial fins previously covered by the fin cut mask have been removed.

FIG. 7A shows an embodiment of the present application wherein the hard mask layer 16, the spacers 42, the plug 44 recessed to expose the top portions of semiconductor fins 46. The hard mask layer, spacers and plug may be partially removed using a recess etch or etch back process. FIG. 7B shows another embodiment of the present application wherein the hard mask layer 16, the sacrificial fins that were covered by the fin cut mask, 24, 26, 28, 30, and 32, the spacers 42, the plug 44 are removed to fully expose the semiconductor fins 46.

FIG. 7A also shows an embodiment of a semiconductor device of the present application. Semiconductor substrate 10 has a surface upon which is an array of sacrificial fins shown as fins 24, 26, 28, 30, and 32, all of which are of substantially the same width. The surface also has upon it at least one sacrificial fin 22 that has a width that is less than the width of the sacrificial fins of the array, namely, as shown, sacrificial fins 24, 26, 28, 30, and 32. In one embodiment, the width of sacrificial fin 22 is about 0.1 to about 0.7 times the width of the sacrificial fins of the array. In another embodiment, the width of sacrificial fin 22 is about 0.3 to about 0.5 times the width of the sacrificial fins of the array. In yet another embodiment, the semiconductor device of the present application also has an array of semiconductor fins, shown as 46 in FIG. 7A, which semiconductor fins 46 are all of substantially the same width, but which width is less than the width of the sacrificial fins of the array, shown as 24, 26, 28, 30, and 32. In one embodiment, the width of semiconductor fins 46 is about 0.1 to about 0.7 times the width of the sacrificial fins of the array. In another embodiment of the semiconductor device of the present application, as shown in FIG. 7A, the lower portions of the semiconductor fins 46 are in trenches 38 (shown in FIG. 5), which trenches have spacers 42 on the vertical sidewalls thereof. In one embodiment, the width of a sacrificial fin of the array, 24, 26, 28, 30, and 32, is substantially equal to the width of a semiconductor fin 46 plus the thickness of the spacers 42 on both vertical sidewalls of trench 38. In one embodiment, the width of a sacrificial fin of the array is substantially equal to the width of a semiconductor fin 46 plus twice the thickness of the spacers 42.

In another embodiment (not shown), a functional gate structure is formed over, e.g. by straddling, a portion of at least one fully exposed semiconductor fin. By "functional gate structure" it is meant a permanent gate structure used to control output current (i.e., flow of carriers in the channel) of a semiconducting device through electrical or magnetic fields. Although a single functional gate structure is described and illustrated, a plurality of functional gate structures can be formed straddling over different portions of semiconductor fins 46. Each functional gate structure can include a gate material stack of, from bottom to top, a gate dielectric portion, and a gate conductor portion. In some embodiments, a gate cap portion can be present atop each gate conductor portion.

Each gate dielectric portion of the functional gate structure comprises a gate dielectric material. The gate dielectric material that provides each gate dielectric portion can be an oxide, nitride, and/or oxynitride. In one example, the gate dielectric material that provides each gate dielectric portion can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as each gate dielectric portion. In some embodiments, each gate dielectric portion comprises a same gate dielectric material. In other embodiments, a first set of functional gate structures comprises a first gate dielectric material while a second set of functional gate structures comprises a second gate dielectric material that differs from the first gate dielectric material.

The gate dielectric material used in providing each gate dielectric portion can be formed by any deposition process including, for example, chemical vapor deposition (CVD), plasma enhanced chemical vapor deposition (PECVD), physical vapor deposition (PVD), sputtering, or atomic layer deposition. In some embodiments and when different gate dielectric materials are used in providing the gate dielectric portions of different functional gate structures, block mask technology can be used. In one embodiment of the present application, the gate dielectric material used in providing each gate dielectric portion can have a thickness in a range from 1 nm to 10 nm. Other thicknesses that are lesser than, or greater than, the aforementioned thickness range can also be employed for the gate dielectric material.

Each gate conductor portion of the functional gate structure comprises a gate conductor material. The gate conductor material used in providing each gate conductor portion can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, each gate conductor portion comprises a same conductive material. In other embodiments, the gate conductor portion of a first functional gate structure comprises a different gate conductor material than a gate conductor portion of a second set of functional gate structures. For example, the gate conductor portion of a first set of functional gate structure may comprise an nFET gate metal, while the gate conductor portion of a second set of functional gate structure may comprise a pFET gate metal.

The gate conductor material used in providing each gate conductor portion can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for gate conductor portions of different functional gate structures, block mask technology can be used. In one embodiment, the gate conductor material used in providing each gate conductor portion has a thickness from 1 nm to 100 nm. Other thicknesses that are lesser than, or greater than, the aforementioned thickness range can also be employed for the gate conductor material used in providing each gate conductor portion.

If present, the gate cap portion of the functional gate structure comprises a gate cap material. The gate cap material that provides the gate cap portion may include one of the hard mask materials mentioned above. In one embodiment, each gate cap portion comprises silicon dioxide, silicon nitride, and/or silicon oxynitride. The material that provides the gate cap portion can be formed utilizing a conventional deposition process such as, for example, chemical vapor deposition or plasma enhanced chemical vapor deposition. The material that provides the gate cap portion can has a thickness from 5 nm to 20 nm. Other thicknesses that are lesser than, or greater than, the aforementioned thickness range can also be employed as the thickness of the material that provides the gate cap portion.

The functional gate structure can be formed by providing a functional gate material stack of, from bottom to top, the gate dielectric material, the gate conductor material and, if present, the gate cap material. The gate material stack can then be patterned. In one embodiment of the present application, patterning of the functional gate material stack may be performed utilizing lithography and etching.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
    a semiconductor substrate having a topmost semiconductor material surface;
    (i) an array of sacrificial fins directly contacting the topmost semiconductor material surface of the semiconductor substrate, wherein each of the sacrificial fins is of substantially the same width;
    (ii) at least one sacrificial fin directly contacting the topmost semiconductor material surface of the semiconductor substrate and having a width that is less than the width of (i) the sacrificial fins of the array, wherein each sacrificial fin is composed of a dielectric material; and
    (iii) an array of semiconductor fins directly contacting the topmost semiconductor material surface of the semiconductor substrate, wherein each of the semiconductor fins is of substantially the same width, and wherein the width of the semiconductor fins (iii) is less than the width of the sacrificial fins (i) of the array.

2. The semiconductor structure of claim 1, wherein the at least one sacrificial fin (ii) has a width that is about 0.1 to about 0.7 times the width of the sacrificial fins (i) of the array.

3. The semiconductor structure of claim 2, wherein the at least one sacrificial fin (ii) has a width that is about 0.3 to about 0.5 times the width of the sacrificial fins (i) of the array.

4. The semiconductor structure of claim 1, wherein the semiconductor fins (iii) have a width that is about 0.1 to about 0.7 times the width of the sacrificial fins (i) of the array.

5. The semiconductor structure of claim 1, wherein the lower portions of semiconductor fins (iii) are in trenches that have spacers on the trench sidewalls.

6. The semiconductor structure of claim 5, wherein the width of a sacrificial fins (i) of the array is substantially equal to the width of a semiconductor fins (iii) plus the thickness of the spacers.

7. The semiconductor structure of claim 1, wherein the semiconductor substrate comprises a bulk semiconductor substrate.

8. The semiconductor structure of claim 1, wherein the semiconductor substrate comprises a semiconductor-on-insulator substrate, and wherein each sacrificial fin is present on a topmost semiconductor material layer of the semiconductor-on-insulator substrate.

9. The semiconductor structure of claim 1, wherein the dielectric material is silicon nitride.

10. The semiconductor structure of claim 1, wherein the dielectric material is silicon boron carbon nitride.

11. The semiconductor structure of claim 1, further comprising a functional gate straddling over each of the semiconductor fins (iii).

12. The semiconductor structure of claim 1, wherein each of the semiconductor fins (iii) has an epitaxial relationship with the topmost semiconductor material surface of the semiconductor substrate.

13. The semiconductor structure of claim 1, wherein each sacrificial fin has a same height.

14. The semiconductor structure of claim 1, wherein each of the semiconductor fins (iii) has a same height and wherein a topmost surface of each of the semiconductor fins (iii) is coplanar with a topmost surface of each sacrificial fin.

* * * * *